US009521785B1

(12) United States Patent
Goldsmith et al.

(10) Patent No.: US 9,521,785 B1
(45) Date of Patent: *Dec. 13, 2016

(54) HEAT CAPTURE SYSTEM FOR ELECTRICAL COMPONENTS PROVIDING ELECTROMAGNETIC PULSE PROTECTION

(71) Applicant: Heatmine LLC, Salem, MA (US)

(72) Inventors: Wendi Goldsmith, Manchester, MA (US); James M. Kramer, Newton, MA (US)

(73) Assignee: Heatmine LLC, Salem, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/541,526

(22) Filed: Nov. 14, 2014

Related U.S. Application Data

(63) Continuation of application No. 13/407,746, filed on Feb. 28, 2012, now Pat. No. 8,913,383.

(51) Int. Cl.
*H05K 7/20* (2006.01)
*H05K 5/06* (2006.01)

(52) U.S. Cl.
CPC .......... *H05K 7/20763* (2013.01); *H05K 5/06* (2013.01); *H05K 7/2039* (2013.01); *H05K 7/20236* (2013.01)

(58) Field of Classification Search
USPC ....... 361/676–678, 679.46–679.54, 688–722
See application file for complete search history.

(56) References Cited

U.S. PATENT DOCUMENTS

| 7,295,436 | B2* | 11/2007 | Cheon .......................... 361/699 |
| 7,515,415 | B2* | 4/2009 | Monfarad et al. ............. 361/699 |
| 7,551,439 | B2* | 6/2009 | Peugh et al. ................... 361/699 |
| 8,009,419 | B2* | 8/2011 | Attlesey et al. .......... 361/679.53 |
| 8,467,188 | B2* | 6/2013 | Hsieh et al. .................... 361/698 |
| 8,490,679 | B2* | 7/2013 | Campbell et al. ............. 165/80.2 |
| 8,913,383 | B1* | 12/2014 | Goldsmith et al. ....... 361/679.53 |
| 2005/0185378 | A1* | 8/2005 | Tilton et al. .................. 361/699 |
| 2005/0205241 | A1* | 9/2005 | Goodson et al. ............ 165/80.4 |
| 2006/0007656 | A1* | 1/2006 | Symons ......................... 361/699 |
| 2010/0103618 | A1* | 4/2010 | Campbell et al. ............. 361/699 |
| 2013/0119489 | A1* | 5/2013 | Chang et al. ................. 257/415 |

OTHER PUBLICATIONS

TeGrotenhuis, et al, "Miniaturization of an Ammonia-Water Absorption Cycle Heat Pump Using Microchannels", International Sorption Heat Pump Conference, Jun. 22-24, 2005, 7 pages.

(Continued)

*Primary Examiner* — Courtney Smith
(74) *Attorney, Agent, or Firm* — Brake Hughes Bellermann LLP (57) ABSTRACT

An apparatus includes an electrically-powered component, a hermitically-sealed, liquid-impermeable, high thermal-conductivity, container encapsulating the electrically-powered component, and a liquid bath surrounding the hermitically-sealed container. The electrically-powered component can include a computer motherboard, a central processing unit of a computer, or an electrical power transformer. The container can include a substance in direct contact with the electrically-powered component and can include a silicone compound, an epoxy compound, or a polyurethane compound.

24 Claims, 3 Drawing Sheets

(56) References Cited

OTHER PUBLICATIONS

"Tempest (codename)", from Wikipedia, the free encyclopedia, retreived on May 3, 2014 from http://en.wikipedia.org/wiki/TEMPEST, Feb. 3, 2014, 7 pages.
Metz, "Google Flushes Heat From Data Center With Toilet Water", Mar. 15, 2012, 3 pages.
"Thermo Life", Thermo Life Energy Corp, Overview, 2005, 12 pages.
"Thermo Life Characteristics", Thermo Life Energy Corp, retrieved on Jun. 2, 2011 from http://www.poweredbythermolife.com/thermolife.html, 1 page.
"Thermoelectric Generator", retrieved from www.tegpower.com, Dec. 16, 2011, 3 pages.
Bullis, "Using Heat to Cool Buildings", retrieved on Dec. 16, 2011 from www.technologyreview.com/printer_friendly_article.aspx?id=37210, 2 pages.
Miller, "Norway's Fjord-Cooled Data Center", Data Center Knowledge, Dec. 20, 2011, 3 pages.
Hruska, "IBM Deploys Hot-Water Cooled Supercomputer", retrieved on May 3, 2014 from http://www.extremetech.com/extreme/131259-ibm-deploys-hot-water-cooled-supercomputer?utm_medium=referral&utm_source=pulsenews, Jun. 18, 2012, 5 pages.
Nagappan, "Oil bath, anyone? Intel servers take a dip", retrieved on May 3, 2014 from http://www.greenbiz.com/news/2012/09/05/oil-bath-anyone-intel-servers-take-dip, Sep. 5, 2012, 3 pages.
Savage, "An Energy-Saving Air Conditiioner", retrieved on Dec. 16, 2011 from www.technologyreview.com/printer_friendly_article.aspx?id=25623, Jun. 17, 2010, 2 pages.
Glanz, "Power, Pollution and the Internet", NYTimes.com, Sep. 22, 2012, 10 pages.
Non-Final Office Action for U.S. Appl. No. 13/407,746, mailed Dec. 19, 2013, 22 pages.
Notice of Allowance for U.S. Appl. No. 13/407,746, mailed Apr. 14, 2014, 5 pages.
Notice of Allowance for U.S. Appl. No. 13/407,746, mailed Aug. 15, 2014, 5 pages.

* cited by examiner

HEAT CAPTURE SYSTEM FOR ELECTRICAL COMPONENTS PROVIDING ELECTROMAGNETIC PULSE PROTECTION

CROSS-REFERENCE TO RELATED APPLICATION

This application is a Continuation of, and claims priority to, U.S. patent application Ser. No. 13/407,746, filed on Feb. 28, 2012, entitled "HEAT CAPTURE SYSTEM FOR ELECTRICAL COMPONENTS PROVIDING ELECTROMAGNETIC PULSE PROTECTION", the disclosure of which is incorporated by reference herein in its entirety.

TECHNICAL FIELD

This description relates to a heat capture system for electrical components, which provides electromagnetic pulse protection.

BACKGROUND

The power consumption of electrical components, including client and server computers, represents a large portion of the total consumption of electricity in office buildings and data centers. Besides the electrical power necessary to operate the electrical devices, electrical power may also be necessary to cool the environment of the electrical devices. Network servers and other electrical equipment generate a significant amount of heat, which becomes a problem when many computers are placed in a confined location, such as a server room. Often, it is necessary to maintain cool air temperatures in these rooms to ensure that the computer equipment functions correctly. Air conditioning is the most common way to maintain workable temperatures for server computer arrays, and several techniques have been devised to reduce the energy demand. Nevertheless, the air-conditioning used by building, and, in particular, the air-conditioning used to cool rooms housing server computers, can account for a large proportion of the energy budget of the building. Significant savings in energy costs can be achieved by finding ways to minimize the energy use required to maintain tolerable temperatures in the environment of the computing devices.

SUMMARY

In a first general aspect an apparatus includes an electrically-powered component, a hermitically-sealed, liquid-impermeable, high thermal-conductivity, container encapsulating the electrically-powered component, and a liquid bath surrounding the hermetically-sealed container.

Implementations can include one or more the following features. For example, the electrically-powered component can include a computer motherboard, a central processing unit of a computer, or an electrical power transformer. The electrically-powered component can be configured to produce heat, when electrically-powered, at a rate of greater than 300 Watts.

The container can include a substance in direct contact with the electrically-powered component, wherein the substance has a thermal conductivity of greater than 1 W/m/K and wherein the substance prevents the liquid bath from contacting the electrically-powered component. The substance can include a silicone compound, an epoxy compound, or a polyurethane compound. The hermetically-sealed container can encapsulate, but not directly contact, the electrically-powered component, and the container can have a thermal conductivity of at least 100 W/m/K. A fan can be disposed within the hermetically-sealed container and configured to move air over the electrically-powered component toward one or more inner walls of the container. The container can include outside walls that include heat dissipating fins.

The liquid bath can surround the electrically-powered components with a thickness of at least 6 inches on all sides of the components. The apparatus can include a liquid circulation circuit through which the liquid bath is configured to flow. The liquid circulation circuit can include a heat extraction element and at least one conduit between the hermetically-sealed container and the heat extraction element, wherein the conduit is configured to allow liquid of the liquid bath to flow from the hermetically-sealed container to the heat extraction element, such that heat is transmitted from the hermetically-sealed container to the heat extraction element. The heat extraction element can be configured to heat a building in which the electrically-powered component is housed.

The apparatus can include a thermoelectric generator configured to receive heat from the heat extraction element and to convert the received heat into electricity. The apparatus can include a heat engine configured to receive heat from the heat extraction element and to convert the received heat into electricity.

The apparatus can include electrical connectors passing though the hermitically-sealed container, where the electrical connectors have first ends electrically connected to the electrically-powered component and second ends electrically connected to a second component. The second component can include a power supply configured to provide power to the electrically-powered component. The second component can include a human input or output device. The human input or output device can include a display device.

The details of one or more implementations are set forth in the accompanying drawings and the description below. Other features will be apparent from the description and drawings, and from the claims.

DETAILED DESCRIPTION

As described herein, waste heat produced by electrically-powered components can be captured and used as a source of energy for one or more productive uses. In some implementations, the captured heat can be used to generate electricity that is used for productive use. In other implementations, the captured heat can be used to heat a building in which the electrically-powered components from which the heat is captured are located. In some implementations, techniques and devices used to capture the waste heat can additionally provide protection against damage to the electrically-powered components due to electro-magnetic pulses. The electrically-powered components can include individual computer processors, computer motherboards and a plurality of electrically-powered components attached to the motherboard, power transformers, power inverters, power supplies, or any electronic or electrical component that produces excess thermal loads that can be captured and used to provide a source of additional energy.

Figure 1:
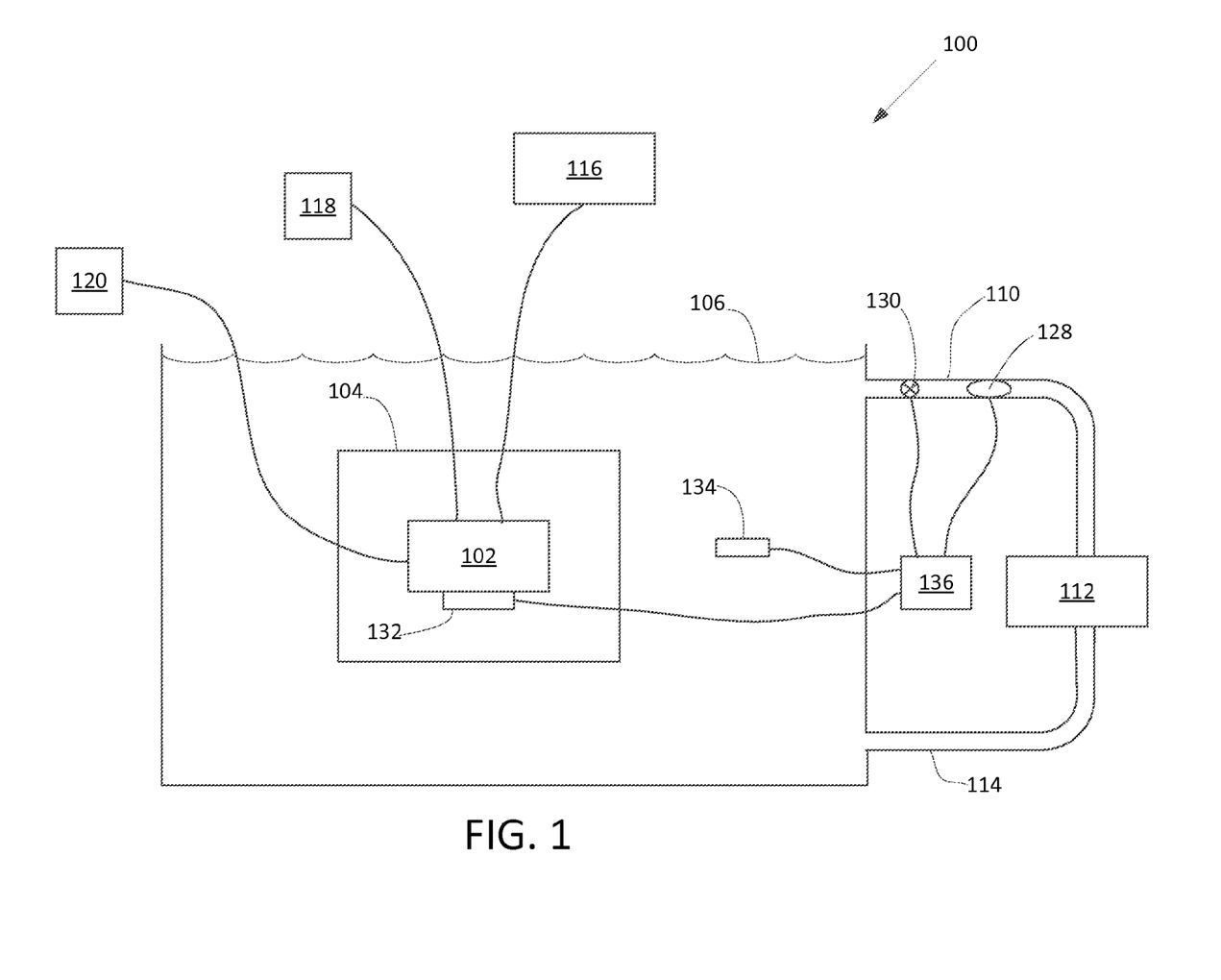
FIG. 1 is a block diagram of an apparatus including an electrically-powered component that is hermetically-sealed within a container that is surrounded by a liquid bath.

FIG. 1 is a block diagram of an apparatus 100 that includes an electrically-powered component 102 that is hermetically-sealed within a container 104 that is surrounded by a liquid bath 106. The container 104 can include material or materials that have a high thermal conductivity that conducts heat efficiently from the electrically-powered components to the liquid bath 106 but which is impermeable to liquid so that the liquid bath 106 does not come in contact with the electrically-powered component 102. In this manner, excess heat can be efficiently exhausted from the electrically-powered component 102 into the liquid bath 106. The removal of excess heat from the electrically-powered components can maintain the component at a temperature below a predetermined threshold temperature so that the components can operate effectively.

The liquid bath 106 can be contained within a vessel 108. In some implementations, the vessel 108 can be open to the environment, as shown in FIG. 1. In other implementations, the vessel 108 can be closed to the external environment. A liquid circulation system attached to the vessel 108 can include an outlet conduit 110 through which liquid from the liquid bath can flow out of the vessel to a heat extraction apparatus 112 and an inlet conduit 114 through which liquid can flow from the heat extraction apparatus back to the vessel 108. As described in more detail below, the heat extraction apparatus 112 can extract heat from the liquid bath 106 and convert the extracted heat into a form of energy that can be used productively. Because heat is extracted from the liquid that flows from the vessel 108 to the heat extraction apparatus 112, the liquid that is returned to the vessel 108 through the inlet conduit 114 generally has a lower temperature than the liquid bath 106 and the vessel 108. In this manner, heat can be exhausted from the electrically-powered component 102 into the liquid bath 106, and then heat can be removed from the liquid bath 106 and used productively.

In some implementations, the outlet conduit 110 can be located above the inlet conduit 114, e.g. the outlet conduit 110 can be located near the top of the vessel 108 and the inlet conduit 114 can be located near the bottom of the vessel 108. In some implementations, liquid that is heated by heat from the electrically-powered component 102 can rise within the vessel 108, and flow through the outlet conduit 110 to the heat extraction apparatus 112 and then return under the force of gravity to the vessel 108 through the inlet conduit 114. Thus, in such a gravity-fed system it may be unnecessary to actively pump the liquid bath 106 through the liquid circulation system that includes the outlet conduit 110, the heat extraction apparatus, and the inlet conduit 114. However, in some implementations, the liquid circulation system may include may include a pump 128 to pump liquid through the conduits 110, 114 and the heat extraction apparatus 112. The liquid circulation system can include a valve 130 that can be opened in order to permit liquid to flow through the conduits 110, 114, and the heat extraction apparatus 112, or which can be closed to prevent liquid from flowing through the liquid circulation system. In some implementations, the outlet conduit 110 may terminate at a wall of the vessel 108. In other implementations, the outlet conduit 110 may be extended through a wall of the vessel 108 and terminated close to the hermetically-sealed container 104, so that cool liquid is delivered directly to the hermetically sealed container 104.

One or more temperature sensors 132, 134. A temperature sensor 132 placed in close proximity to the electrically-powered component 102, e.g., within the hermetically-sealed container 104, to monitor a temperature of the electrically-powered component. The temperature sensor 134 located in the liquid bath 106 can monitor a temperature of the liquid bath 106. The temperature sensors 132, 134 can be coupled to a controller 136 input from the temperature sensors and, based on the input, controls other elements of the system 100. For example, the controller can open and close valve 130 and can turn on and off pump 128 based on input from the temperature sensors 132, 134. For example, when input from temperature sensor 132 indicates that a temperature of the electrically-powered component 102 is approaching a threshold temperature, the controller 134 may open valve 130 can turn on pump 128. In other implementations, when input from temperature sensor 134 indicates that the temperature of the liquid bath 106 is below a threshold temperature that is needed to provide sufficient heat to heat extraction apparatus 112 for the apparatus 112 to perform its intended function, controller 134 may close valve 130 and turn off pump 128.

In some implementations, the electrically-powered component 102 can include a component of a computing system. For example, in the implementation shown in FIG. 2, the electrically-powered component 102 can include a motherboard of a computing device with a plurality of electrically-powered components attached to the motherboard. The motherboard can be encapsulated in the container 104 and then submerged in the liquid bath 106.

Figure 2:
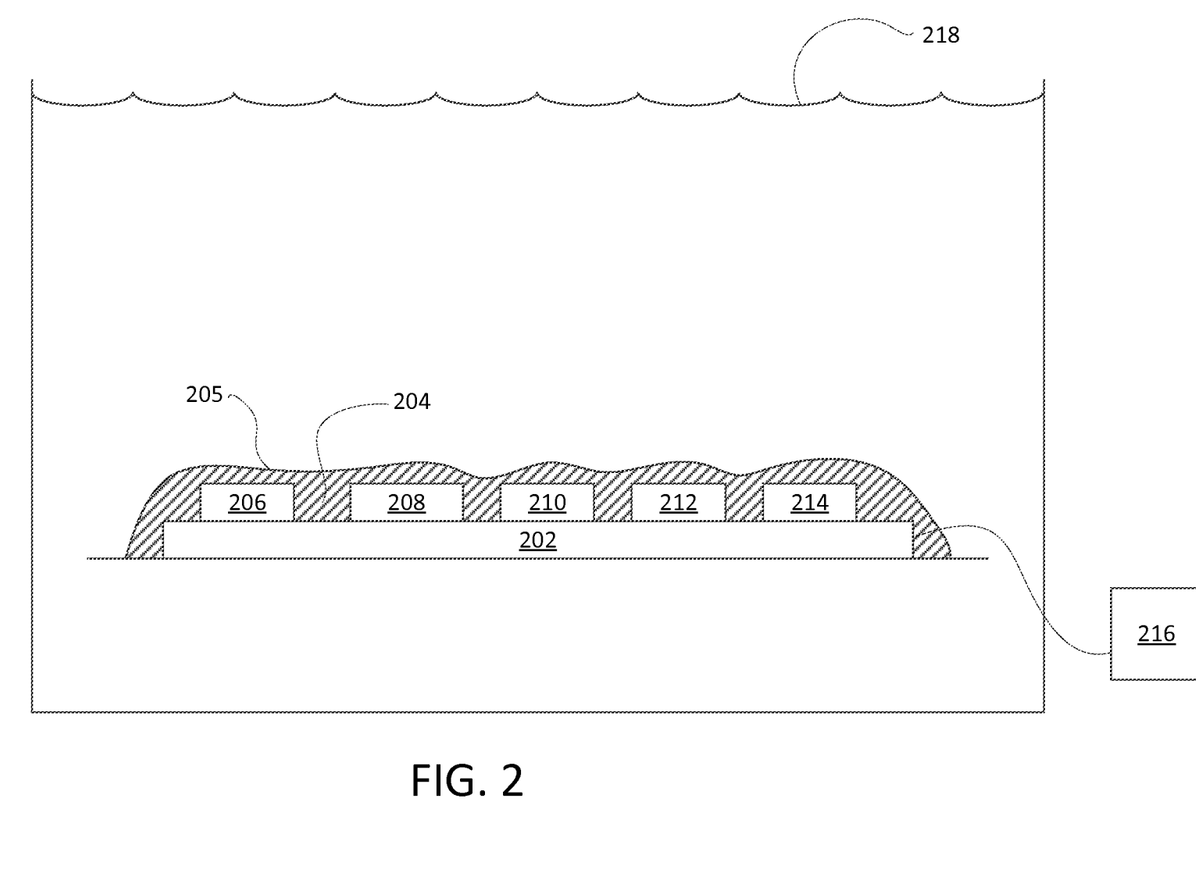
FIG. 2 is a schematic diagram of a system that includes a motherboard of a computer, which is encapsulated by a liquid-impermeable, high-thermal conductivity container.

Electrical signals can be transmitted between electrical components located on the motherboard 102 and one or more electrical devices 116 located outside the liquid bath 106. For example, an electrical device 116 located outside the liquid bath can include a human interface device such as, for example, a keyboard, a mouse, a display screen, etc. In another implementation, an interface 118 to the electrically-powered component 102 can communicate a plurality of signals from outside the liquid bath 106 to the electrically-powered component 102 that is located within the liquid bath. For example, the interface 118 can include a transmitter and a receiver that may transmit signals to and receive signals from a plurality of different human interface devices (e.g., a mouse, a keyboard, a video display, audio speakers, etc.). The interface 118 can communicate wirelessly or through a wired connection with the different human interface devices. In some implementations, a power source 120 can be electrically connected to the electrically-powered component 102. The power source 120 can include, for example, a battery or a line power source, and the power source 120 can be located either within (in the case of a battery) the liquid bath 106 or outside of the liquid bath.

FIG. 2 is a schematic diagram of a system 200 that includes a motherboard 202 of a computer, which is encapsulated by a liquid-impermeable, high-thermal conductivity container 204. A number of electrically-powered components can be attached to the motherboard. For example the motherboard 202 can be attached to a first processor 206 (e.g., a central processing unit), a second processor 208 (e.g., a graphics processor), a chipset 210, a memory device 212, and a power transformer 214. One or more of the electrically-powered components 206-214, either individually or collectively, can produce heat at a rate of 300 Watts or more. At least part of the motherboard 202 and at least some of the electrically-powered components 206-214 attached to the motherboard are encapsulated in a container 204 that is impermeable to liquid. The container 204 can be in direct contact with the motherboard 202 and the electrically-powered components 206-214. The assembly of the motherboard 202, the electrical components 206-214 that are attached to the motherboard, and the container 204 that encapsulates the components can be submerged in a liquid bath 218.

The motherboard 202 can be electrically connected to a power supply 216 that supplies power to the motherboard 202, which in turn relays the electrical power to the electrically-powered components 206-214. The various electrically-powered components 206-214 consume the electrical power supplied by the power source 216 as they perform various functions related to the operation of the computer. However, not all of the electrical power that is consumed is used to perform functions related to the operation of the computer. Rather, some of the electrical power is dissipated as heat by the electrically-powered components 206-214. Because the container 204 that encapsulates and hermetically seals the motherboard 202 and the components 206-214 that are attached to the motherboard has a high thermal conductivity, heat generated by the components due to their dissipation of electrical power can be transferred away from the components to the outer surface 205 of the container 204. Because the outer surface 205 of the container 204 is in contact with the liquid bath 218, heat can be readily transferred from the surface 205 into the liquid bath 218.

Although FIG. 2 illustrates encapsulation of a motherboard 202 and electrically-powered components attached to the motherboard, this is but one implementation of the techniques described herein, and encapsulation of other electrically-powered, heat-generating components is also possible. For example, electrical power transformers can be encapsulated by container material that has a high thermal conductivity and that is impermeable to water.

The container 204 can be formed from a various different materials or combinations of materials that have a high thermal conductivity to promote the transfer of heat from the electrically-powered components 206-214 to the liquid bath and that are impermeable to liquid so that the liquid bath does not come in contact with the components 206-214. In some implementations, the thermal conductivity of the material(s) used for the container 204 has a thermal conductivity greater than 0.5 Watts per meter per Kelvin (W·m$^{-1}$·K$^{-1}$). In some implementations, the thermal conductivity of the material(s) used for the container 204 has a thermal conductivity greater than 1.0 W/m/K. In some implementations, the thermal conductivity of the material(s) used for the container 204 has a thermal conductivity greater than 2.0 W/m/K. In some implementations, the thermal conductivity of the material(s) used for the container 204 has a thermal conductivity greater than 5.0 W/m/K. In addition, the material(s) used for the container 204 should have a high electrical resistance. In some implementations, the container 204 can include a silicone material. In some implementations, the container 204 can include epoxy material. In some implementations, the container 204 can include a polyurethane material. Combinations of different materials also can be used.

Epoxy materials can be durable, impermeable to liquid, but the epoxy material may be difficult to remove from the motherboard 202 or the electrically-powered components 206-214. Silicone is available as a rubber, paste, and grease and provides a high resistance to liquid and can be relatively inert. Additionally, silicone can be designed to function as a removable encapsulating container so that it is possible to remove the container from the electrically-powered components 206-214, so that the components may be serviced should the need arise. The permeability to liquid may be lower for silicone as compared with epoxy over an extended timescale, because silicone may have a tendency to absorb liquid very slowly over time. Thus, it may be desirable to remove the motherboard encapsulated by the container 204 from the liquid bath 218 from time to time and to allow the silicone container material 204 to air dry. After air drying, the encapsulated motherboard system may be re-submerged in the liquid bath.

Polyurethane materials can have high thermal conductivities, high electrical resistance, very low moisture absorption, and can shrink very little when curing or when changing temperature. This combination of features can be advantageous when using polyurethane materials in the container 204, because the electrical components of the motherboard 202 to which the polyurethane material would adhere would be at relatively low risk of damage due to shrinkage of the polyurethane during curing and because the low moisture absorption of the material would create an effective barrier between the liquid bath 218 and the motherboard 202.

The encapsulating material of the container 204 can be applied to the electrical components 206-214 of the motherboard 202 in a way designed to increase the thermal conductivity of heat away from the electrical components through the encapsulating material to the liquid bath 218. For example, the motherboard 202, and its associated electrical components 206-214, can be heated above room temperature so that when the encapsulating material is applied, the material flows well over features of the motherboard and its components (e.g., raised objects on the motherboard and small spaces and gaps between components and the motherboard), so that the encapsulating material of the container 204 seals tightly against all the services of the motherboard and its components. For example, when a polyurethane material is used for the encapsulating material of the container 204, the motherboard and its components can be heated to a temperature of about 90° F. before the encapsulating material is applied. Prior to applying the encapsulating material of the container 204, the material can be degassed to remove air bubbles that might otherwise impede the thermal conductivity of the material. In addition, the encapsulating material may be applied to the motherboard 202 in several layers or "pours," and that are allowed to cure before the next layer is applied, to promote degasification of the material in each layer before the next layer is applied.

The liquid bath 218 can include various different liquids. For example, the liquid bath 218 can include mineral oil, such as oils that are used in electrical transformers. Highly refined mineral oil can be stable at high temperatures, and can have a high electrical resistivity. In other implementations, water can be used for the liquid bath 218. In some implementations, for example where it is desirable to have a liquid with a high electrical conductivity, salt water, or water treated with salt, can be used for the liquid bath 218.

When the electrically-powered components 206-214 are submerged in the liquid bath 218, the electrically-powered components may be radiation hardened, i.e. protect the components against electromagnetic pulses, such as those caused by naturally occurring solar flares and cosmic rays or such as those caused by human weapons such as high altitude nuclear explosions and other non-nuclear electromagnetic devices. Submerging the electrically-powered components 206-214 in the liquid bath 218 can shield the components from high-energy radiation such as cosmic rays, gamma radiation, electromagnetic pulses, and other types of electromagnetic waves that cannot penetrate a given thickness of liquid barrier. The thickness of the liquid barrier surrounding the electrically-powered components 206-214 can be adjusted to match the anticipated intensity of the radiation or electromagnetic energy. Besides providing a mechanical barrier to high-energy radiation, the liquid bath 218 can also protect the submerged components 206-214 by providing electromagnetic shielding of the components. For example, by providing a liquid bath with a high conductivity, the liquid bath 218 can act as a Faraday cage that electrically isolates the components within the container 204 within the liquid bath from electromagnetic waves outside the liquid. Thus, for example, salt water may be used advantageously in the liquid bath 218 to provide electromagnetic isolation and protection from electromagnetic energy to electrically-powered components within the container 204.

In addition to inhibiting electromagnetic energy from being transmitted from the outside environment to the components 206-214 in the container 204, the hermetically sealed container 204 submerged in the liquid bath 218 also can inhibit the transmission of electromagnetic signals from the components 206-214 to the outside environment. This can be advantageous to prevent remote surveillance of the components. For example, electromagnetic eavesdropping through surveillance of high-frequency noise emitted by the CPU 206 can be inhibited by encapsulating the CPU 206 in the container 204 and submerging the container in the liquid bath 218.

Figure 3:
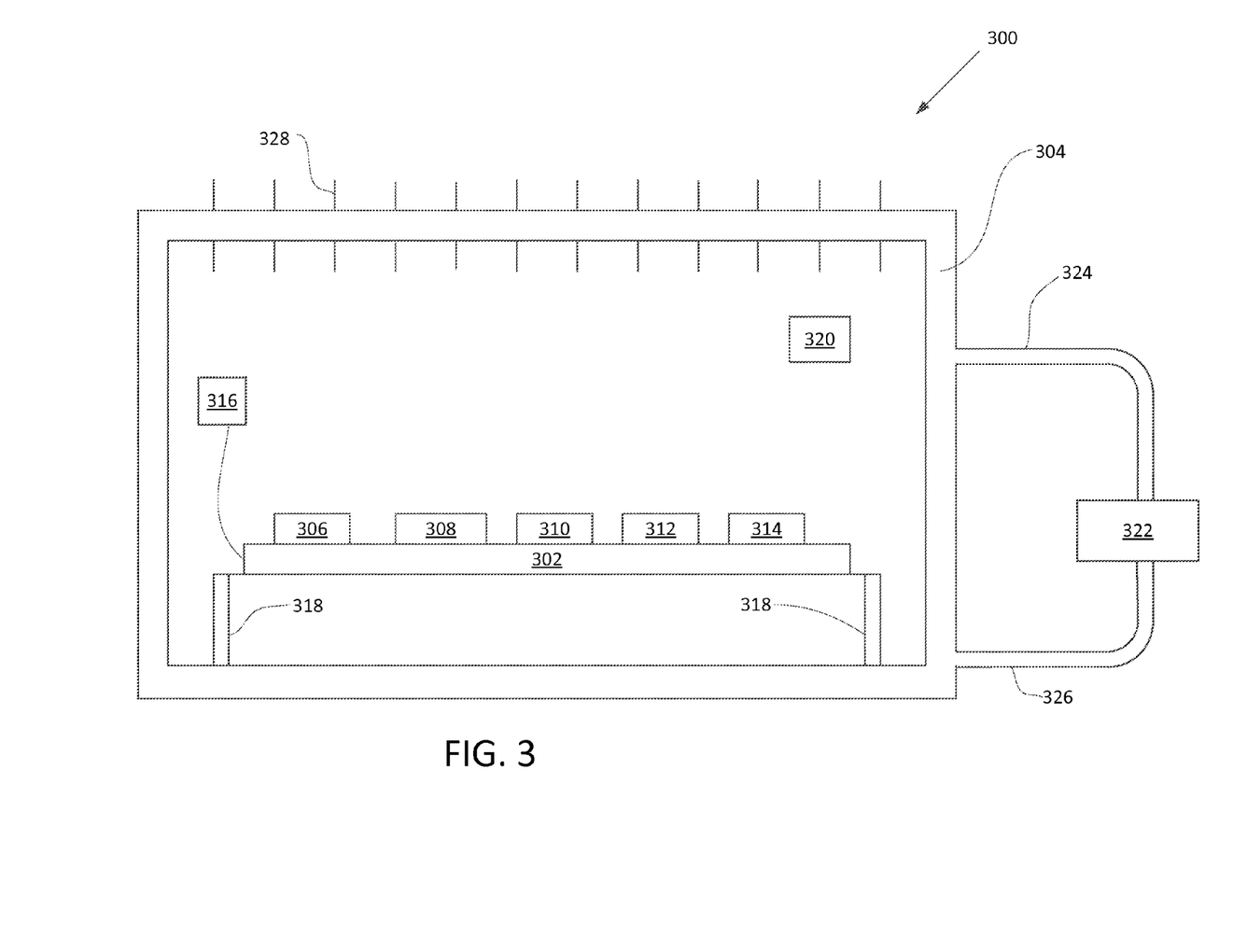
FIG. 3 is a schematic diagram of another system that includes a motherboard of a computer, which is encapsulated by a liquid-impermeable, high-thermal conductivity container.

FIG. 3 is a schematic diagram of another system 300 that includes a motherboard of a computer, which is encapsulated by a liquid-impermeable, high-thermal conductivity container. The system 300 includes a motherboard 302 on which a plurality of electrically-powered components 306, 308, 310, 312, 314 are mounted. The motherboard 302 can be enclosed in a container 304 that is made of high conductivity material, e.g. aluminum, aluminum alloys, copper, copper alloys, etc. the motherboard 302 can be mounted on electrically insulating standoffs 318, so that the motherboard and its electrically-powered components 306-314 are electrically isolated from the container 304. The thermal conductivity of the solid container 304 can be greater than 100 Watts per meter per Kelvin ($W \cdot m^{-1} \cdot K^{-1}$).

The motherboard 302 can receive electrical power from a power supply 316 that is electrically connected to the motherboard, and the motherboard can transfer the electrical power to the electrically-powered components 306-314. The components 306-314 can generate heat when they are electrically powered, and the heat can be removed from within the container 304 to the walls of the container. A fan 320 can circulate air within the enclosure of the container 304 and the circulating air can transfer heat from the electrically-powered components 306-314 to the walls of the container 304. Heat can be transferred through the walls of the container 304 and thereby removed from the immediate environment of the electrically-powered components. One or more inner walls of the container 304 and/or one or more outer walls of the container 304 can include a plurality of fins 328 that extend from the wall of the container to increase the surface area of the wall of the container, thus increasing the ability of the container 304 to transfer heat from the inside of the container to the outside of the container.

The walls of the container 304 can provide protection against electromagnetic pulses to the electrically-powered components 306-314. Because the walls of the container 314 are conductive they may shunt electromagnetic energy from outside the container away from the electrically-powered components 306-314. Additionally, the thickness of the walls of the container 304 may protect the electrically-powered components 306-314 from alpha- and beta-radiation.

The walls of the container 304 can be partially hollow, thereby defining conduits within the walls through which fluid may flow, and fluid may be pumped through the conduits to provide additional cooling of the walls and to extract heat from the walls of the container 304. In this context, the fluid pumped through the conduits in the walls of the container 304 can constitute a liquid bath surrounding the inner walls of the container 304. The fluid may flow out of the conduits within the walls of the container 304 through an outlet conduit 324 that transfers fluid from the container 304 to a heat extraction apparatus 322. The heat extraction apparatus 322 may remove heat from the flowing fluid and may return relatively cooler fluid to the conduits within the walls of the container 304 through an inlet conduit 326.

As shown in FIG. 3, in the system 300 the container 304 is not in direct contact with the electrically-powered components 306-314. The motherboard 300 to and its associated electrically-powered components can be connected to other components that may be located inside or outside the container 304. For example, the power supply 316 may be located within the container 304 or maybe located external to the container, in which case an electrical connection between the power supply 316 and the motherboard 302 can pass through a hole in the wall of the container 304. When the area of the hole is small compared to the area of the walls of the container, the ability of the container 304 to dissipate heat is not compromised significantly. Additionally, when the dimensions of the hole are small compared with the wavelengths of electromagnetic waves associated with electromagnetic pulses, the ability of the container 304 to provide protection against electromagnetic pulses is not compromised significantly.

In another implementation, the container 304 can completely enclose the motherboard 302 and its electrically-powered components 306-314, so that fluid cannot pass between the inside and the outside of the container 304. In such an implementation, the container 304 can be submerged in a liquid bath that extracts heat from the walls of the container 304.

Referring again to FIG. 1, the heat extraction apparatus 112 can utilize a variety of different techniques and designs to extract heat from the liquid bath 106 that transfers heat away from the electrically-powered component 102 to convert the extracted heat into energy for a productive secondary use. In one implementation, the heat extraction apparatus 112 can include a radiator that extracts heat from the circulating liquid bath 106, from the heat can be used directly for heating purposes. For example, a radiator may receive heat from the circulating liquid bath 106 and use the extracted heat to heat a building that that houses the electrically-powered component 102. Therefore, rather than expending energy to operate cooling equipment to maintain the electrically-powered component 102 at its designed operating temperature than expending additional energy to heat the building that houses the electrically-powered component, waste heat produced by the component can be removed from the component with the liquid bath 106 and transferred to the radiator, where the waste heat can be used productively to heat the building. Such an implementation may be especially advantageous for businesses or in buildings that consume significant energy to power electrically-powered components—e.g., large numbers of computers that typically require active cooling with a dedicated cooling system, such as an air-conditioning system—where the businesses or buildings also expend energy to heat the building.

In some implementations, the heat extraction apparatus can be located at least 500 feet from the electrically-powered component 102, and the liquid circulation system can be thermally-insulated, so that a heat (e.g., infrared) image of the system 102 will show a stronger signal in the vicinity of the heat extraction apparatus 112 than in the vicinity of the electrically-powered component 102. Particularly, when the heat extract apparatus 112 includes a radiator, such an implementation can be advantageous for confusing systems designed to detect and target particular activity by their heat signatures.

In another implementation, the heat extraction apparatus 112 can include a thermoelectric generator that is configured to receive heat from the circulating liquid bath 106 and to convert the received heat into electricity. The heat from the circulating liquid bath 106 can be applied to a thermoelectric generator that includes a bimetallic junction to produce a temperature gradient across the thermoelectric generator the temperature gradient applied to the bimetallic junction of the thermoelectric generator then generates the corresponding electrical potential difference across the junction, via the Seebeck effect. The electric potential difference can be used to provide electrical power to a variety of different applications, such as, for example, lighting, cooling, driving a motor, etc.

In another implementation, the heat extraction apparatus 112 can include an absorption refrigerator that can operate on heat extracted from the circulating liquid bath 106. The absorption refrigerator can use the heat provided by the circulating liquid bath 106 to drive a cooling system. Unlike a compressor refrigerator, the absorption refrigerator has no moving parts and condenses the refrigerant of the cooling system by absorbing the gaseous refrigerant into another liquid. The refrigerant-laden liquid is heated at least in part with the heat from the circulating liquid bath 106, causing the refrigerant to evaporate out of the absorbing liquid. The refrigerant is then condensed through a heat exchanger to replenish the supply of liquid refrigerant. Thus, heat transferred away from the electrically-powered component 102 into the liquid bath 106 can be transferred by the circulating liquid bath to the absorption refrigerator, where the heat can be used to drive a cooling system. In this manner, the waste heat from the electrically-powered component can be used productively in a cooling system. Such an implementation may be especially advantageous for businesses or in buildings that consume significant energy to power electrically-powered components—e.g., large numbers of computers that typically require active cooling with a dedicated cooling system, such as an air-conditioning system—where the businesses or buildings also expend energy to drive separate cooling systems to cool the building that houses the components.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
   an electrically-powered component;
   a liquid-impermeable, container, wherein the container encapsulates the electrically-powered component;
   a liquid bath surrounding the container, wherein the liquid bath provides electromagnetic shielding of the electrically-powered component, and
   wherein the container includes a substance in contact with the electrically-powered component, wherein the substance has a thermal conductivity of greater than 1 $W \cdot m^{-1} \cdot K^{-1}$ and wherein the substance prevents the liquid bath from contacting the electrically-powered component.

2. The apparatus of claim 1, wherein the electrically-powered component includes a computer motherboard.

3. The apparatus of claim 1, wherein the electrically-powered component includes a central processing unit of a computer.

4. The apparatus of claim 1, where the electrically-powered component produces heat, when electrically-powered, at a rate of greater than 300 Watts.

5. The apparatus of claim 1, wherein the substance includes a silicone compound.

6. The apparatus of claim 1, wherein the substance includes an epoxy compound.

7. The apparatus of claim 1, wherein the liquid bath surrounds the electrically-powered component with a thickness of at least 6 inches on all sides of the component.

8. The apparatus of claim 1, further comprising a liquid circulation circuit through which the liquid bath is configured to flow.

9. The apparatus of claim 8, wherein the liquid circulation circuit includes a heat extraction element and at least one conduit between the container and the heat extraction element through, wherein the conduit is configured to allow liquid of the liquid bath to flow from the container to the heat extraction element, such that heat is transmitted heat from the container to the heat extraction element.

10. The apparatus of claim 9, wherein the heat extraction element is configured to convert transmitted heat extract to heat a building in which the electrically-powered component is housed.

11. The apparatus of claim 9, wherein the heat extraction element includes a thermoelectric generator configured to convert the transmitted heat into electricity.

12. The apparatus of claim 9, wherein the heat extraction element includes an absorption refrigerator configured to utilize the transmitted heat to operate an absorption refrigerator.

13. The apparatus of claim 9, wherein the heat extraction element is located at least 500 feet away from the electrically-powered component.

14. The apparatus of claim 9, further comprising electrical connectors passing though the container, the electrical connectors being electrically connected to the electrically-powered component and being electrically connected to a second electrical component.

15. The apparatus of claim 14, wherein the second component includes a power supply configured to provide power to the electrically-powered component.

16. The apparatus of claim 14, wherein the second component includes a human input device.

17. The apparatus of claim 16, wherein the second component includes a display device.

18. The apparatus of claim 1, wherein the liquid bath includes salt water.

19. The apparatus of claim 1, wherein the liquid bath includes mineral oil.

20. The apparatus of claim 1, wherein the liquid bath is configured to act as a Faraday cage that electrically isolates the electrically-powered component from electromagnetic waves outside the liquid bath.

21. The apparatus of claim 1, wherein the electrically-powered component includes a power transformer.

22. The apparatus of claim 1, wherein a thickness of the liquid bath surrounding the electrically-powered component is sufficiently thick to shield the electrically-powered component from an anticipated intensity of inbound high-energy radiation.

23. The apparatus of claim 1, wherein a thickness of the liquid bath surrounding the electrically-powered component is sufficiently thick to prevent electromagnetic surveillance of high-frequency noise emitted by the electrically-powered component.

24. The apparatus of claim 1, wherein a thickness of the liquid bath surrounding the electrically-powered component is sufficiently thick to shield outbound radiation from the electrically-powered component to prevent one or more of: electromagnetic surveillance of the apparatus, electromagnetic detection of the apparatus, electromagnetic interference by the apparatus of another electrical device, thermal surveillance of the apparatus, and thermal detection of the apparatus.

* * * * *